United States Patent
Ide et al.

(10) Patent No.: US 8,339,037 B2
(45) Date of Patent: Dec. 25, 2012

(54) ORGANIC LIGHT EMITTING DEVICE WITH REDUCED ANGLE DEPENDENCY

(75) Inventors: Nobuhiro Ide, Yonezawa (JP); Jun Endo, Yonezawa (JP); Junji Kido, Yonezawa (JP)

(73) Assignees: Panasonic Corporation, Kadoma-shi (JP); Rohm Co., Ltd., Kyoto-shi (JP)

( * ) Notice: Subject to any disclaimer, the term of this patent is extended or adjusted under 35 U.S.C. 154(b) by 242 days.

(21) Appl. No.: 10/593,630

(22) PCT Filed: Mar. 23, 2005

(86) PCT No.: PCT/JP2005/005224
§ 371 (c)(1), (2), (4) Date: Sep. 21, 2006

(87) PCT Pub. No.: WO2005/094130
PCT Pub. Date: Oct. 6, 2005

(65) Prior Publication Data
US 2008/0272689 A1    Nov. 6, 2008

(30) Foreign Application Priority Data

Mar. 26, 2004   (JP) .................................. 2004-092618

(51) Int. Cl.
*H01L 51/50* (2006.01)
*H01L 51/52* (2006.01)
*H01L 51/54* (2006.01)

(52) U.S. Cl. ..................... 313/506; 313/504; 313/509

(58) Field of Classification Search ........... 313/498–512
See application file for complete search history.

(56) References Cited

U.S. PATENT DOCUMENTS 4,752,717 A * 6/1988 Mental ...................... 313/511
(Continued)

FOREIGN PATENT DOCUMENTS

CN    1447629 A    10/2003
(Continued)

OTHER PUBLICATIONS

Supplementary European Search Report for European Application No. 03748732.9 mailed Oct. 16, 2007.
(Continued)

*Primary Examiner* — Anne Hines
*Assistant Examiner* — Jose M Diaz
(74) *Attorney, Agent, or Firm* — Edwards Wildman Palmer LLP

(57) ABSTRACT

The present invention provides an organic light emitting device which can reduce the angle dependency of the emission brightness and the emission color, and has a small change in the emission brightness and the emission color with respect to film thickness fluctuations, and can increase use efficiency of the light. The organic light emitting device of the present invention has a plurality of emission layers 3 between an anode 1 and a cathode 2, and the emission layers 3 are separated from each other by an equipotential surface forming layer 4 or a charge generating layer 4. The feature of the present invention resides in that the organic light emitting device has, at least either inside or outside the device, a light scattering means 5 for scattering light emitted from the emission layers 3. The organic light emitting device can reduce the angle dependency of the emission brightness and the emission color by outputting the light emitted from the emission layers in a condition where the light is scattered by the light scattering means.

5 Claims, 5 Drawing Sheets

U.S. PATENT DOCUMENTS

| | | | |
|---|---|---|---|
| 5,231,933 A | 8/1993 | DiRosa et al. | |
| 5,814,416 A * | 9/1998 | Dodabalapur et al. | 428/690 |
| 5,891,554 A | 4/1999 | Hosokawa et al. | |
| 6,091,197 A | 7/2000 | Sun et al. | |
| 6,891,330 B2 * | 5/2005 | Duggal et al. | 313/511 |
| 2001/0033135 A1 | 10/2001 | Duggal et al. | |
| 2002/0061418 A1 * | 5/2002 | Imanishi | 428/690 |
| 2003/0102801 A1 * | 6/2003 | Senbonmatsu | 313/506 |
| 2003/0127967 A1 * | 7/2003 | Tsutsui et al. | 313/498 |
| 2003/0170491 A1 * | 9/2003 | Liao et al. | 428/690 |
| 2003/0189401 A1 | 10/2003 | Kido et al. | |
| 2004/0004682 A1 * | 1/2004 | Kato et al. | 349/61 |
| 2004/0012980 A1 | 1/2004 | Sugiura et al. | |
| 2004/0041516 A1 * | 3/2004 | Watanabe et al. | 313/498 |
| 2004/0061136 A1 * | 4/2004 | Tyan et al. | 257/200 |
| 2004/0104672 A1 * | 6/2004 | Shiang et al. | 313/506 |
| 2005/0051791 A1 * | 3/2005 | Gotoh et al. | 257/99 |
| 2005/0052129 A1 * | 3/2005 | Yamashita | 313/506 |
| 2005/0134174 A1 | 6/2005 | Shiratori et al. | |
| 2005/0233156 A1 * | 10/2005 | Senzaki et al. | 428/446 |
| 2006/0097630 A1 * | 5/2006 | Shiokawa et al. | 313/504 |
| 2006/0186802 A1 * | 8/2006 | Cok et al. | 313/506 |
| 2007/0099024 A1 * | 5/2007 | Nii et al. | 428/690 |
| 2007/0182317 A1 | 8/2007 | Kido et al. | |
| 2009/0153030 A1 * | 6/2009 | Huo et al. | 313/504 |
| 2011/0284893 A1 * | 11/2011 | Hoeppel et al. | 257/98 |

FOREIGN PATENT DOCUMENTS

| | | |
|---|---|---|
| DE | 295 09 604 U1 | 6/1995 |
| EP | 0442248 A1 | 8/1991 |
| JP | 61-156691 | 7/1986 |
| JP | 5-42035 | 6/1993 |
| JP | 08-127337 | 5/1996 |
| JP | 9-129375 | 5/1997 |
| JP | 11-329748 | 11/1999 |
| JP | 2002-110363 | 4/2002 |
| JP | 2003-36969 | 2/2003 |
| JP | 2003-45676 | 2/2003 |
| JP | 2003-272860 | 9/2003 |
| JP | 2003264085 A * | 9/2003 |
| JP | 2005-31251 | 2/2005 |
| JP | 2005-183213 A | 7/2005 |
| WO | WO 2004095892 A1 * | 11/2004 |
| WO | WO 2005029923 A1 * | 3/2005 |

OTHER PUBLICATIONS

Office Action dated Dec. 11, 2009, issued on the Chinese Patent Application No. 2005800171803 and English translation thereof.

Supplemental European Search Report dated Apr. 21, 2010, issued on the European Patent Application No. 05726966.4.

European Search Report issued Oct. 21, 2010, for European Patent Application No. 10173511.6.

* cited by examiner

US 8,339,037 B2

ORGANIC LIGHT EMITTING DEVICE WITH REDUCED ANGLE DEPENDENCY

TECHNICAL FIELD

The present invention relates to a light emitting device which is used for a flat panel display, a back light of a liquid crystal display (LCD), a light source of lighting, illuminations, and a light source for a sign.

BACKGROUND ART

Generally, in an organic light emitting device known and described as an organic electroluminescence device (an organic EL device), an anode which is a transparent electrode, a hole transport layer, an organic emission layer, an electron injection layer, and a cathode are stacked on one side of a transparent substrate in this order. When a voltage is applied between the anode and the cathode, an electron injected into the emission layer through the electron injection layer and a hole injected into the emission layer through the hole transport layer recombine in the emission layer, and an excited state occurs and light is emitted. The light emitted from the emission layer is taken out through the transparent electrode and the transparent substrate.

In recent years, in such an organic light emitting device, a so-called multiphoton device in which a plurality of organic emission layers are stacked between the anode and the cathode and an equipotential surface forming layer (an equipotential surface forming layer) or a charge generating layer is provided between each adjacent emission layers has been proposed to achieve high intensity emission and a long life span (see Japanese Non-examined Patent Publication No. 11-329748, Japanese Non-examined Patent Publication No. 2003-45676, Japanese Non-examined Patent Publication No. 2003-272860, and so on).

FIG. 12 shows one example of a structure of an organic light emitting device formed as such a multiphoton device, in which a plurality of emission layers 3 are stacked between an anode 1 and a cathode 2 in a condition where an equipotential surface forming layer 4 or a charge generating layer 4 is provided between each adjacent emission layers 3, and they are stacked on a surface of a transparent substrate 10. The anode 1 is formed as an optically-transparent electrode and the cathode 2 is formed as a light reflective electrode. Although a hole transport layer and an electron injection layer are formed on both sides of the emission layer 3, the hole transport layer and the electron injection layer are not shown in FIG. 12. By separating the plurality of emission layers 3 by the equipotential surface forming layer 4 or the charge generating layer 4, the plurality of emission layers 3 can emit at the same time as if they are connected in series, and the light from each emission layer 3 are combined, whereby high current efficiency and quantum efficiency which were impossible for a conventional organic light emitting device (organic EL device) can be realized, and high intensity emission can be achieved (see Japanese Non-examined Patent Publication No. 2003-45676, and Japanese Non-examined Patent Publication No. 2003-272860).

The feature of the organic light emitting device structure resides in that; it is a thin film device having a film thickness on the order of optical wavelengths; it has a refractive index step or a reflecting surface formed by a metal surface inside the device; and it emits light from an emission layer which is a high refractive index medium. In this structure, a phenomenon of an optical interference effect or light confinement in a high refractive index medium, such as the emission layer of an organic film, the substrate, and the electrode, by a total reflection may be occurred, and as a result, angle dependency of emission brightness and emission spectrum, film thickness dependency, and deterioration of light use efficiency are observed. This problem is occurred in the above organic light emitting device which is the multiphoton device having a plurality of emission layers. As to the optical interference effect, it becomes possible to realize an improvement of chromatic purity and to realize control of directional characteristics, and so on, by using it appropriately, and particularly, it is useful for use in a flat panel display and the like. For example, Japanese Non-examined Patent Publication No. 7-240277 and Japanese Non-examined Patent Publication No. 2000-323277 disclose a fact that it is possible to emphasize a wavelength by adjusting an optical distance between the emission layer and the light reflective electrode to an even number multiple of the ¼ wavelength or by adjusting an optical distance between the emission layer and a maximum refractive index step position to an even number multiple of the ¼ wavelength, and particularly, it is known that the optical distance between the emission layer and the light reflective electrode have a great influence on the emission spectrum. The above Japanese Non-examined Patent Publication No. 2003-272860 further discloses a fact that it is possible to obtain light emission of highest efficiency and a fact that a shape of the emission spectrum gets thin by setting all optical film thicknesses between an emission point of each of the emission layers and the light reflective electrode to odd numbers multiple of the ¼ wavelength.

However, in the organic light emitting device in which the chromatic purity and so on were improved by optimizing the optical distance between the emission layer and the light reflective electrode or the optical distance between the emission layer and the maximum refractive index step position, namely, the film thickness of the device, fluctuations of the emission brightness and an emission color become large when the film thickness varies. This means that an allowable fluctuation of the film thickness in a manufacturing process of the organic light emitting device becomes smaller, and it is directly linked to a productivity problem. Particularly, in the above organic light emitting device having a structure in which the emission layers and the equipotential surface forming layers or the charge generating layers are stacked, accuracy and inevitability of the film thickness control further increase because film thickness abnormality of any layer may affect on even the optical position of other layers.

Furthermore, in the above Japanese Non-examined Patent Publication No. 2003-272860, although the optical distance between the emission layer and the light reflective electrode was set to an even number (2n+1, where n=0, 1, 2, . . . ) multiple of the ¼ wavelength, it is known that angle dependency of the brightness and the spectrum increases with the increase of the value of "n". That is, in a organic light emitting device having only one emission layer, the fluctuation of the emission brightness and the emission color with respect to the film thickness variation is not necessarily large because such a device is often designed in the optical distance equivalent to "n=0", but in the above organic light emitting device having multiple emission layers, because each emission layer is located at a position of (2n+1) times the ¼ wavelength, a particular wavelength is remarkably emphasized with the increase of the number of layers, and as a result, there is a problem that an emission spectrum that is greatly different from a spectrum that the emission layer originally has may be given and the angle dependency becomes large.

Therefore, although the above organic light emitting device having multiple emission layers separated by the equipotential surface forming layer or the charge generating layer can certainly realize high current efficiency and quantum efficiency that were impossible for a conventional organic light emitting device, it does not necessarily have a desirable characteristic with respect to the emission spectrum and the angle dependency.

In order to solve such problems, it is described in the above Japanese Non-examined Patent Publication No. 2003-272860 that, in the organic light emitting device having a plurality of emission layers, the optical interference effect is cancelled by absorbing a part of generated light by a light absorption means or by diffusely reflecting it by a light diffuse reflection means, and therefore, adjustment of the optical film thickness between the emission point and the light reflective electrode becomes practically unnecessary. However, in the above Japanese Non-examined Patent Publication No. 2003-272860, it does not refer to the problem of the angle dependency which the organic light emitting device has, and the problem has not been solved yet.

DISCLOSURE OF THE INVENTION

In view of the above problem, the object of the present invention is to provide an organic light emitting device which can reduce the angle dependency of the emission brightness and the emission color, and has a small change in the emission brightness and the emission color with respect to film thickness fluctuations, and can increase use efficiency of the light.

The organic light emitting device of the present invention has a plurality of emission layers between an anode and a cathode, and the plurality of emission layers are separated from each other by an equipotential surface forming layer (a layer which forms an equipotential surface) or a charge generating layer. The feature of the present invention resides in that the organic light emitting device has a light scattering means for scattering light emitted from the emission layers, and the light scattering means is disposed at least either inside or outside the device.

The organic light emitting device of the present invention can reduce the angle dependency of the emission brightness and the emission color by outputting the light emitted from the emission layers in a condition where the light is scattered by the light scattering means, and as a result, the change of the emission brightness and the emission color with respect to the film thickness fluctuations becomes small, whereby the use efficiency of the light can be increased.

Preferably, the light scattering means is made up by forming at least one of the anode and the cathode by a light-scattering and light-reflective electrode.

Or, it is also preferable that the light scattering means is made up by forming at least one of the anode and the cathode by an optically-transparent electrode and providing a light-scattering and light-reflective element on the optically-transparent electrode on the opposite side of the emission layers.

Or, it is also preferable that the light scattering means is made up by forming at least one of the anode and the cathode by a light-scattering and optically-transparent electrode.

Or, it is also preferable that the light scattering means is made up by forming at least one of the anode and the cathode by an optically-transparent electrode and providing a light-scattering and optically-transparent element on the optically-transparent electrode on the opposite side of the emission layers.

Or, it is also preferable that the light scattering means is made up by forming the equipotential surface forming layer or the charge generating layer so that it has a light scattering property.

Or, the organic light emitting device of the present invention has a plurality of emission layers between an anode and a cathode, and the emission layers are separated from each other by an equipotential surface forming layer or a charge generating layer, and the feature of the present invention resides in that both the anode and the cathode are formed by optically-transparent electrodes, and a light reflective element is provided on one of the optically-transparent electrodes on the opposite side of the emission layers, and a distance between the light reflective element and the emission layers is set to a distance where optical interference does not occur substantively.

In this case, it is possible to output the light emitted from the emission layers in a condition where interference unevenness and so on are prevented from occurring by setting the distance between the light reflective element and the emission layers to a distance where optical interference does not occur, whereby the organic light emitting device of the present invention can reduce the angle dependency of the emission brightness and the emission color. As a result, the change of the emission brightness and the emission color with respect to the film thickness fluctuations become small and the use efficiency of the light can be increased.

The plurality of emission layers may comprise emission layers of at least two different emission colors. In this case, it becomes possible to form the organic light emitting devices of many colors.

Preferably, an emission color of the organic light emitting device is white. In this case, it is possible to use the organic light emitting device for a back light of a liquid crystal display, a light source of lighting, and so on.

BEST MODE FOR CARRYING OUT THE INVENTION

Hereinafter, the present invention will be described in more detail with reference to the accompanying drawings.

Figure 1:
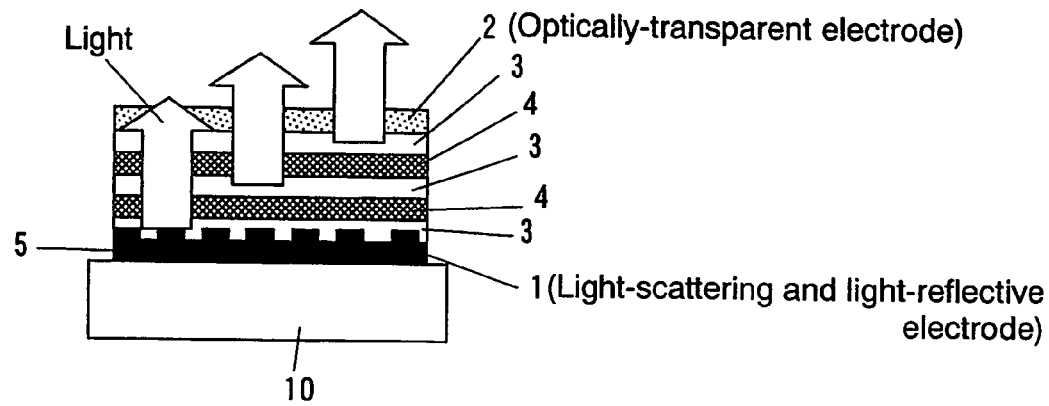
FIG. 1 is a schematic sectional view showing one example of an embodiment of Claim 2 of the present invention.

FIG. 1 shows one example of the embodiment of Claims 1 and 2 of the present invention, in which a plurality of emission layers 3 are stacked between an anode 1 and a cathode 2 with an equipotential surface forming layer 4 (a layer which forms an equipotential surface) or a charge generating layer 4 sandwiched between each adjacent emission layers 3, and these emission layers 3 are stacked on a surface of a substrate 10. Although a hole transport layer is stacked on the anode 1 side of each emission layer 3 as needed and an electron injection layer is stacked on the cathode 2 side thereof as needed, the hole transport layer and the electron injection layer are not shown in FIG. 1 (and subsequent FIGS). And, although FIG. 1 and subsequent FIGS show a constitution having three emission layers 3 and two equipotential surface forming layers 4 or two charge generating layers 4, these figures show only one example, and the number of layers is not limited thereto.

In the embodiment of FIG. 1, although the anode 1 is formed as a light reflective electrode and the cathode 2 is formed as an optically-transparent electrode, conversely, the anode 1 may be formed as an optically-transparent electrode and the cathode 2 may be formed as a light reflective electrode, and the anode 1 and the cathode 2 may be interchanged and the cathode 2 may be formed on the surface of the substrate 10.

A material and a formation method of the light reflective electrode are not particularly limited, and any materials and any formation methods can be applied unless they prevent the effect of the present invention. For example, when the cathode 2 is used as the light reflective electrode, a metal simple substance, such as Al, Zr, Ti, Y, Sc, Ag, In, alkali metal, alkali earth metal, and rare-earth metal, and an alloy or an oxide thereof, and a halide, and combined use of these and a metal doped organic layer described, for example, in Japanese Non-examined Patent Publication No. 10-240171 can be used. When the anode 1 is used as the light reflective electrode, a metal such as Au, Pd, Pt, and so on can be used. Or, the light reflective electrode may be formed by a combination of an optically-transparent electrode, such as a metal ultrathin film of indium-tin oxide (ITO), indium-zinc oxide (IZO), tin oxide, Au, and so on, or a conductive polymer, or a conductive organic material, and any reflecting surfaces.

As to the optically-transparent electrode, it is possible to use any material unless it prevents the effect of the present invention. For example, a metal ultrathin film of indium tin oxide (ITO), indium zinc oxide (IZO), tin oxide, Au, and so on, or a conductive polymer, or a conductive organic material, or a dopant (donor or acceptor)-containing organic layer, or a laminated body thereof can be used.

As to an organic luminescence material or a doping material which can be used for the emission layers 3, anthracene, naphthalene, pyrene, tetracene, coronene, perylene, phthaloperylene, naphthaloperylene, diphenylbutadiene, tetraphenylbutadiene, coumalin, oxadiazole, bisbenzoxazolin, bis styryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, 1-aryl-2,5-di(2-thienyl)pyrrole derivative, pyrene, quinacridone, rubrene, distyrylbenzene derivative, distyrylarylene derivative, distyrylamine derivative, and various types of fluorescence dye are included, but not limited thereto. Preferably, 90-99.5 pts.wt. of luminescence material selected from these compounds and 0.5-10 pts.wt. of doping material is included. Not only compounds which generate fluorescent emission as represented by the above compounds, but also phosphorescent material which generates phosphorescence emission and a compound which has a body part composed of that material inside a molecule can be used favorably.

As to a hole-transport material for forming the hole transport layer, a compound that has an ability to transport holes and has a hole injection efficiency from the anode 1 as well as an excellent hole injection efficiency to the emission layer 3 and can prevent a movement of the electron to the hole transport layer and has an excellent thin film forming ability can be used. Concretely speaking, phthalocyanine derivative, naphthalocyanine derivative, porphyrin derivative, aromatic diamine compound such as N,N'-bis(3-methylphenyl)-(1,1'-biphenyl)-4,4'-diamine (TPD) and 4,4'-bis[N-(naphthyl)-N-phenyl-amino]biphenyl (a-NPD), oxazole, oxadiazole, triazole, imidazole, imidazolone, stilbene derivative, pyrazoline derivative, tetrahydroimidazole, polyarylalkane, butadiene, 4,4',4''-tris(N-(3-methylphenyl)N-phenylamino)triphenylamine (m-MTDATA), and high-polymer materials of conductive polymer such as polyvinyl carbazole, polysilane, polyethylenedioxidethiophene (PEDOT) are included, but not limited thereto.

As to an electron transport material for forming the electron transport layer, a compound that has an ability to transport electrons and has an electron injection efficiency from the cathode 2 as well as an excellent electron injection efficiency to the emission layer 3 and can prevent a movement of the holes to the electron transport layer and has an excellent thin film forming ability can be used. Concretely speaking, florene, bathophenanthroline, bathocuproin, anthraquinodimethane, diphenoquinone, oxazole, oxadiazole, triazole, imidazole, anthraquinodimethane, and so on, and a compound thereof, and a metal complex compound and nitrogenous five-membered ring derivative can be used. As to the metal complex compound, concretely speaking, tris(8-hydroxyquinolinate)aluminum, tri(2-methyl-8-hydroxyquinolinate)aluminum, tris(8-hydroxyquinolinate)gallium, bis(10-hydroxybenzo[h]quinolinate)beryllium, bis(10-hydroxybenzo[h]quinolinate)zinc, bis(2-methyl-8-quinolinate)(o-cresolate)gallium, bis(2-methyl-8-quinolinate)(1-naphtholate)aluminum are included, but not limited thereto. As to the nitrogenous five-membered ring derivative, oxazole, thiazole, oxadiazole, thiadiazole, triazole derivative are desirable. Concretely speaking, 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4''-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl) 1,3,4-triazole, 3-(4-biphenylyl)-4-phenyl-5-(4-t-butylphenyl)-1,2,4-triazole are included, but not limited thereto. Also, polymer material used for polymer organic electroluminescent device can be used. For example, polyparaphenylene and a derivative thereof, and florene and a derivative thereof can be used.

As described in Japanese Non-examined Patent Publication No. 2003-45676, the equipotential surface forming layer 4 means a layer which does not substantively have electric potential difference in both a thickness direction and a surface direction in applying a voltage, and concretely speaking, it comprises a material having a specific resistance less than $1.0 \times 10^2$ Ω·cm. As mentioned above, in the organic light emitting device, an electron injected into the emission layer 3 from the cathode 2 side and a hole injected into the emission layer 3 from the anode 1 side recombine in the emission layer 3, and an excited state occurs, whereby it emits light. By separating the plurality of emission layers 3 from each other by means of the equipotential surface forming layer 4, electron-hole recombination occurs in each of the plurality of emission layers 3, and multiple light emissions can be generated between the anode 1 and the cathode 2.

As to a material of the equipotential surface forming layer 4, a material that is described in Japanese Non-examined Patent Publication No. 2003-45676 can be used. For example, a layer comprising a conductive material, a metal film which is so ultrathin as to have transparency, an object formed by laminating a dielectric material and a metal film, and a conductive organic matter are included, but not particularly limited thereto. Concretely speaking, a thin film of ITO, IZO, $SnO_2$, $ZnO_2$, and Al, $Au/Bi_2O_2$, fullerenes, metallophthalocyanine, and so on can be used.

The charge generating layer 4 is an electrically insulating layer with specific resistance of greater than or equal to $1.0 \times 10^2 \Omega \cdot cm$ as described in Japanese Non-examined Patent Publication No. 2003-272860, and is a layer which serves to inject holes in the cathode 2 direction and inject electrons in the anode 1 direction in applying voltage. Even though all layers (the emission layers 3 and the charge generating layers 4 and so on) sandwiched between the cathode 2 and the anode 1 are formed by electrically insulating layers, a plurality of emission layers 3 come to act as if they are connected in series through the charge generating layers 4 by separating the plurality of emission layers 3 from each other by means of the charge generating layers 4, whereby it becomes possible to generate multiple light emissions between the anode 1 and the cathode 2.

As to a material of the charge generating layer 4, a material that is described in Japanese Non-examined Patent Publication No. 2003-272860 can be used. Preferably, vanadium pentoxide, and an object that has a laminated constitution of, for example, a radical cation state layer and a radical anion state layer as a charge transfer complex, but not particularly limited thereto.

In the embodiment of FIG. 1, one of the anode 1 and the cathode 2 is formed as the light reflective electrode, and the other is formed as the optically-transparent electrode, and a surface of the light reflective electrode on the emission layer side is formed unevenly so that it has a light scattering property. By this light-scattering and light-reflective electrode, a light scattering means 5 is formed. In the embodiment of FIG. 1, the anode 1 is formed as the light-scattering and light-reflective electrode, and the cathode 2 is formed as the optically-transparent electrode.

The method for forming the surface of the light reflective electrode unevenly is not particularly limited. For example, a method which forms unevenness on a surface of the substrate 10 or on a surface of a layer for forming an electrode provided on the surface of the substrate 10 by means of a sandblast process, a frost process, a stamp process, an etching process, and so on, and then forms an electrode on the uneven surface, or a method which forms a film on a base material, such as an organic series resin and a glass, on which various particles, such as resin beads, glass, hollow glass beads, silica, barium oxide, titanic oxide, and so on, were dispersed, by means of a coating or a sol-gel method to form a film having uneven surface, and then forms an electrode on the uneven surface, can be applied. Or, a method which forms an uneven pattern on a surface of the substrate 10 by photoresist and so on, and then forms an electrode on the uneven pattern, and a method which forms an electrode whose thickness differs partly by means of a mask, and so on can be applied. Or, various methods which transfers or pastes unevenness formed on another base material onto the substrate, without directly forming the unevenness on the surface of the substrate 10, can be also applied. The size of the unevenness of the surface of the light reflective electrode have only to satisfy a property which scatters light, and it is selected appropriately according to a forming method. The pattern of the unevenness of the light reflective electrode may be random, or it may be a zone plate or a diffraction grating whose size was determined as needed. Preferably, the size, the pattern, and the direction of the evenness are selected appropriately according to an intended emission wavelength, and the evenness is formed on a predetermined position of the substrate 10.

In the organic light emitting device constituted as above, some light emitted from each emission layer 3 travels to the cathode 2 side, which is the optically-transparent electrode, and is outputted from the cathode 2, and other light which traveled to the anode 1 side from each emission layer 3 is reflected by the anode 1, which is the light-reflective electrode, and is outputted from the cathode 2. At that time, because the anode 1 is also the light scattering electrode, the light is scattered and reflected by the surface of the anode 1. Therefore, because the scattered reflected light is outputted from the cathode 2 of the optically-transparent electrode in random directions, and does not generate optical interference with the light traveled to the cathode 2 from the emission layers 3, the angle dependency of the emission brightness and the emission color can be reduced. And as a result, the change of the emission brightness and the emission color with respect to the film thickness fluctuations of each layer of the organic light emitting device becomes small, whereby use efficiency of the light can be increased.

Figure 2:
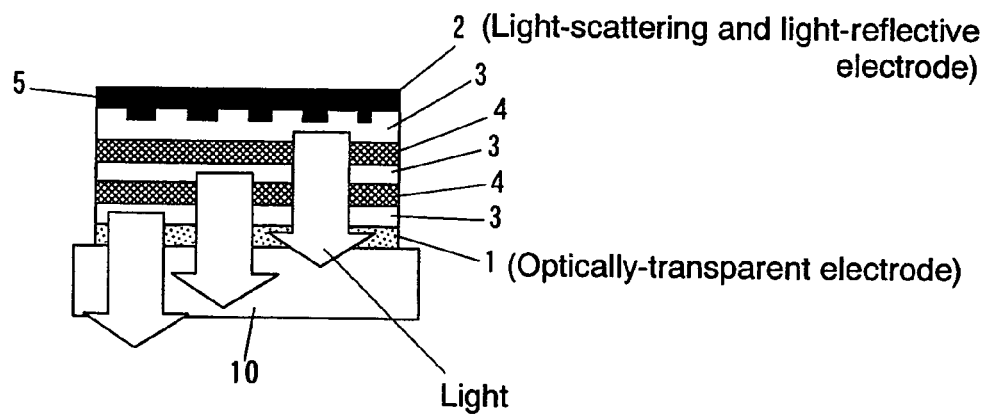
FIG. 2 is a schematic sectional view showing one example of another embodiment of Claim 2.

FIG. 2 shows one example of other embodiments of Claims 1 and 2 of the present invention. Although, in the embodiment of FIG. 1, the electrode provided on the substrate 1 was formed so as to have the light scattering property and the light reflective property, in this embodiment, the electrode provided on the substrate 1 is formed to be optically transparent, and the electrode provided on a portion except the substrate 1 is formed so as to have the light scattering property and the light reflective property. In the embodiment of FIG. 2, the cathode 2 is formed as the light-scattering and light-reflective electrode, and the anode 1 is formed as the optically-transparent electrode.

In the embodiment of FIG. 2, the surface of the light reflective electrode on the emission layer 3 side is formed unevenly so that it has a light scattering property. As to the method for forming the unevenness, a method which gives variations to a film thickness of the electron injection layer provided on the emission layer 3 by a mask and so on so as to form the layer unevenly, and then forms an electrode thereon can be applied. Other constitutions are the same as FIG. 1.

In this embodiment, some light emitted from each emission layer 3 travels to the anode 1 side, which is the optically-transparent electrode, and is outputted through the anode 1 and the substrate 10, which is made of glass and so on to be transparent, and other light which traveled to the cathode 2 side from each emission layer 3 is reflected by the cathode 2, which is the light reflective electrode, and is outputted through the anode 1 and the substrate 10. At that time, because the cathode 2 is also the light scattering electrode, the light is scattered and reflected by the surface of the cathode 2. Because the reflected light is outputted through the optically-transparent anode 1 and the substrate 10 in random directions and does not generate optical interference with the light traveled to the anode 1 side from the emission layers 3, the angle dependency of the emission brightness and the emission color can be reduced.

Figure 3:
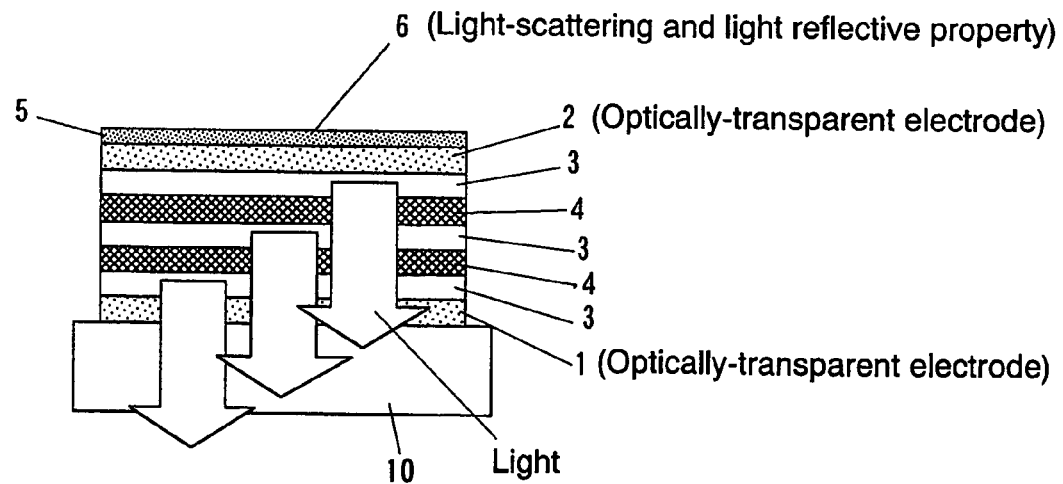
FIG. 3 is a schematic sectional view showing one example of an embodiment of Claim 3.

FIG. 3 shows one example of an embodiment of Claims 1 and 3 of the present invention. The anode 1 and the cathode 2 each are formed as an optically-transparent electrode, and a light-scattering and light-reflective element 6 is provided on one of the optically-transparent anode 1 and the optically-transparent cathode 2 on the opposite side of the emission layers. In the embodiment of FIG. 3, the light-scattering and light-reflective element 6 is provided on the cathode 2 which is the optically-transparent electrode on the opposite side of the emission layers 3. Of course, the anode 1 and the cathode 2 can be interchanged. By this light-scattering and light-reflective element 6, the light scattering means 5 is formed. There is no need to form the light-scattering and light-reflective element 6 directly on the surface of the electrode, and it may be formed in the optical proximity thereof.

As to the light-scattering and light-reflective element 6, the element 6 can be formed by a light reflective film whose surface on the electrode side has a light scattering property, such as a reflective film formed by a metal thin film of aluminum, chrome, silver, and so on by means of vapor deposition, sputtering, and any other arbitrary method, a reflective film on which reflective particles are applied, and a reflective film comprising a multilayer film of a dielectric and so on. The method for forming the light scattering property is not particularly limited, but for example, a method which forms an uneven surface by above-mentioned various methods explained in the method for forming the uneven surface, a method which forms a light scattering layer by applying a mixture of a base material and particles which have different refractive indexes from each other, a method which forms a light scattering layer by a sol-gel method in a constitution for finally generating a plurality of components, a method which forms a layer showing a scattering property by a layer having a cavity inside it or a phase separation of a plurality of materials, and a method which forms a layer having a light scattering property or a diffraction property by arranging or scattering microscopic particles on the surface, can be applied. Or, it is also possible to form the light-scattering and light-reflective element 6 by combining an after-mentioned light reflective layer 6a and a light scattering layer 6b. Other constitutions are the same as FIG. 1.

In the organic light emitting device of FIG. 3 formed as above, some light emitted from each emission layer 3 travels to the anode 1 side, which is the optically-transparent electrode, and is outputted through the anode 1 and the substrate 10, which is made of glass and so on to be optically transparent, and other light which traveled to the cathode 2 side from each emission layer 3 is reflected by the light-scattering and light-reflective element 6 after passing through the cathode 2, and is outputted through the anode 1 and the substrate 10. At that time, because the light is scattered and reflected by the light-scattering and light-reflective element 6, the scattered reflected light is outputted through the optically-transparent anode 1 and the substrate 10 in random directions and does not generate optical interference with the light traveled to the anode 1 side from the emission layers 3. Therefore, the angle dependency of the emission brightness and the emission color can be reduced.

Figure 4:
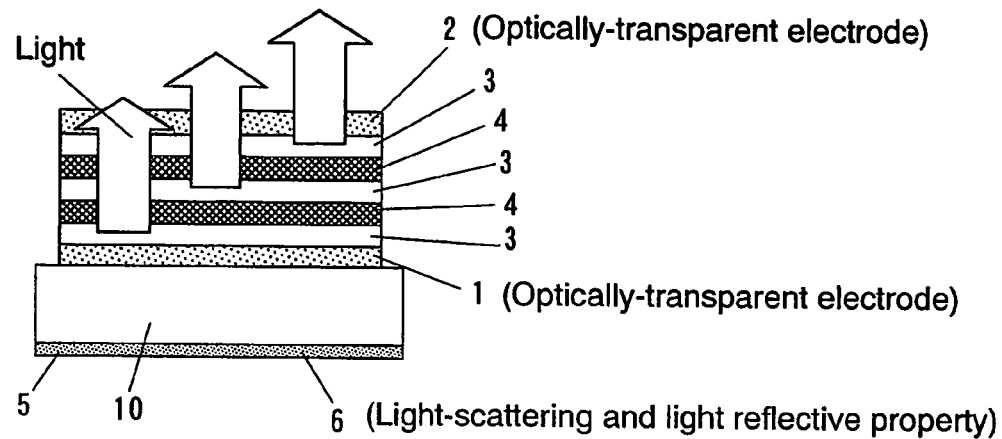
FIG. 4 is a schematic sectional view showing one example of another embodiment of Claim 3.

FIG. 4 shows one example of other embodiments of Claims 1 and 3 of the present invention. In this embodiment, the anode 1 and the cathode 2 each are formed as an optically-transparent electrode, and the light-scattering and light-reflective element 6 is provided on an outer surface of the optically-transparent substrate 10 on the opposite side of the anode 1. Of course, the anode 1 and the cathode 2 can be interchanged. The light-scattering and light-reflective element 6 can be formed by the same method as the embodiment of FIG. 3. The element 6 may be formed on the substrate 10 directly, or the element may be formed on another base material separately and then transferred to or pasted on the substrate as needed. Or, the optically-transparent substrate 10 itself may have the light scattering property. The material and the constitution of the light scattering substrate 10 is not particularly limited, but for example, an material which was given the scattering property by a blending and phase segregation method of a plurality of polymers, and an material having the scattering property by partially including a component which has a different refractive index or a reflective component can be used. Other constitutions are the same as FIG. 1.

In the organic light emitting device of this embodiment, some light emitted from each emission layer 3 travels to the cathode 2 side, which is the optically-transparent electrode, and is outputted through the cathode 2, and other light which traveled to the anode 1 side from each emission layer 3 is reflected by the light-scattering and light-reflective element 6 after passing through the anode 1 and the substrate 10, and is outputted from the cathode 2. At that time, because the light is scattered and reflected by the light-scattering and light-reflective element 6, the scattered reflected light is outputted through the optically-transparent cathode 2 in random directions and does not generate optical interference with the light traveled to the cathode 2 side from the emission layers 3. Therefore, the angle dependency of the emission brightness and the emission color can be reduced.

Figure 5:
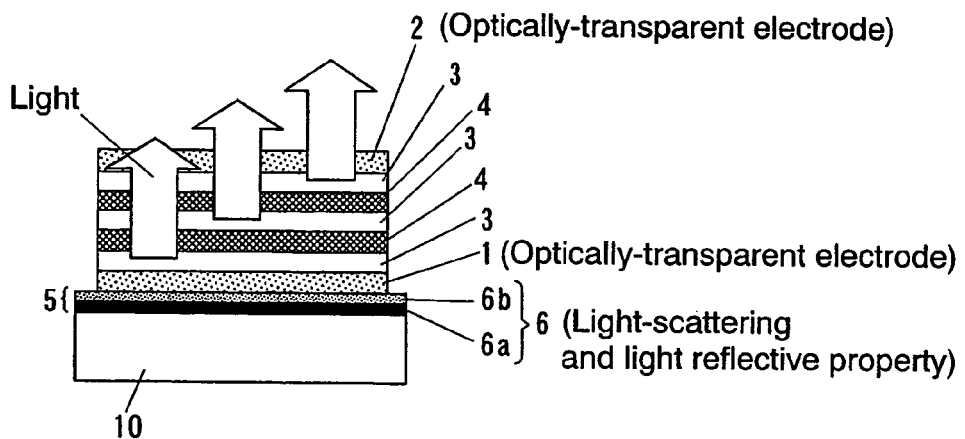
FIG. 5 is a schematic sectional view showing one example of another embodiment of Claim 3.

FIG. 5 shows one example of still other embodiments of Claims 1 and 3 of the present invention. The anode 1 and the cathode 2 each are formed as an optically-transparent electrode, and the light-scattering and light-reflective element 6 is provided between the anode 1 and the substrate 10. Of course, the anode 1 and the cathode 2 can be interchanged. In the embodiment of FIG. 5, the light scattering and the light reflective element 6 is formed so that it has a two-layer structure comprising a light reflective layer 6a on the opposite side of the anode 1 and a light scattering layer 6b on the anode 1 side.

The kind and the forming method of the light reflective layer 6a are not particularly limited, but a metal thin film of aluminum, chrome, silver, and so on formed by means of vapor deposition, sputtering, and any other arbitrary method, and a layer in which reflective particles are applied, and a layer formed by a multilayer film of a dielectric and so on can be applied.

The kind and the forming method of the light scattering layer 6b are not particularly limited, but for example, a layer in which unevenness formed by means of above-mentioned various methods explained in the method for forming the uneven surface serves as a scattering layer, a scattering layer formed by coating a mixture of a base material and particles which have different refractive indexes from each other, a scattering layer formed by a sol-gel method in a constitution for finally generating a plurality of components, a layer having a cavity inside it, a layer showing a scattering property by a phase separation of a plurality of materials, and a layer which was given a light scattering property or a diffraction property by arranging or scattering microscopic particles on the surface, can be applied. These layers 6a and 6b may be formed on the substrate 10 directly, or may be formed on another base material separately and then transferred to or pasted on the substrate as needed. Other constitutions are the same as FIG. 1.

In the organic light emitting device of this embodiment, some light emitted from each emission layer 3 travels to the cathode 2 side, which is the optically-transparent electrode, and is outputted through the cathode 2, and other light which traveled to the anode 1 side from each emission layer 3 is reflected by the light reflective layer 6a after passing through the anode 1, and is outputted through the cathode 2. At that time, because the light is scattered by the light scattering layer 6b when reflected by the light reflective layer 6a, the scattered reflected light is outputted through the optically-transparent cathode 2 in random directions and does not generate optical interference with the light traveled to the cathode 2 side from the emission layers 3. Therefore, the angle dependency of the emission brightness and the emission color can be reduced.

Figure 6:
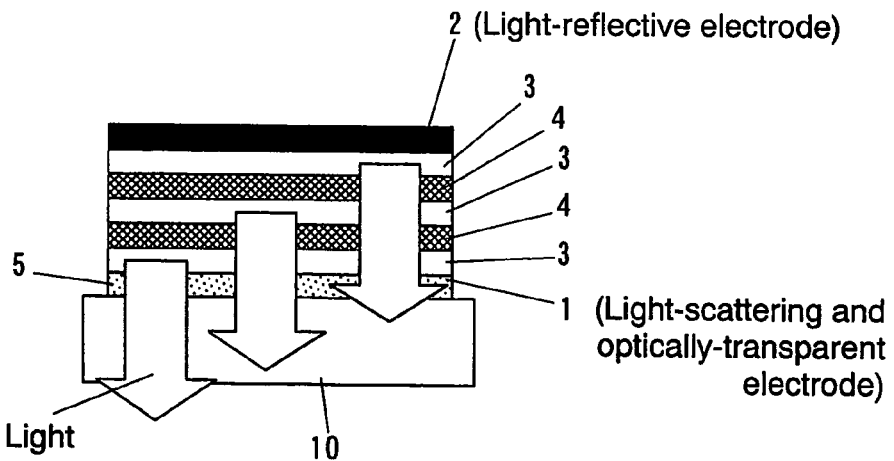
FIG. 6 is a schematic sectional view showing one example of an embodiment of Claim 4.

FIG. 6 shows one example of an embodiment of Claims 1 and 4 of the present invention, in which one of the anode 1 and the cathode 2 is formed by a light reflective electrode, and the other is formed by a light-scattering and optically-transparent electrode. By this light-scattering and optically-transparent electrode, the light scattering means 5 is formed. In the embodiment of FIG. 6, the anode 1, on the substrate 10 side, is formed by the light-scattering and optically-transparent electrode, and the cathode 2, on the opposite side of the substrate 10, is formed by the light reflective electrode. Of course, the anode 1 and the cathode 2 can be interchanged.

A kind and a forming method of the light-scattering and optically-transparent electrode are not particularly limited, but for example, a method which gives the light scattering property by forming an optically-transparent electrode having an uneven shape using a mask, a method which gives the light scattering property by partly etching an optically-transparent electrode to give an uneven shape thereto, a method which gives the light scattering property by forming an uneven shape on a surface of the substrate 10 as mentioned above in advance and forming an optically-transparent electrode thereon to form a uneven shape, a method which gives the light scattering property by forming an optically-transparent electrode comprising a plurality of materials having different refractive indexes from each other, and a method which obtains the light scattering property by applying a transparent conductive material such as ITO and microparticles, such as silica, having different refractive index from the transparent conductive material, and then burning it so as to form an electrode component whose refractive index is different partly, can be applied. Other constitutions are the same as FIG. 1.

In the organic light emitting device of FIG. 6 formed as above, some light emitted from each emission layer 3 travels to the anode 1 side and is outputted through the anode 1 and the substrate 10, which is made of glass and so on to be optically transparent, and other light which traveled to the cathode 2 side from each emission layer 3 is reflected by the light reflective cathode 2 and is outputted through the anode 1 and the substrate 10. At that time, because the anode 1 is formed to have a light-scattering property and optical transparency, the light is scattered when it passes through the anode 1. Therefore, both the light traveled to the anode 1 side and the reflected light are outputted through the anode 1 and the substrate 10 in random directions in a scattered condition, whereby the angle dependency of the emission brightness and the emission color can be reduced.

Figure 7:
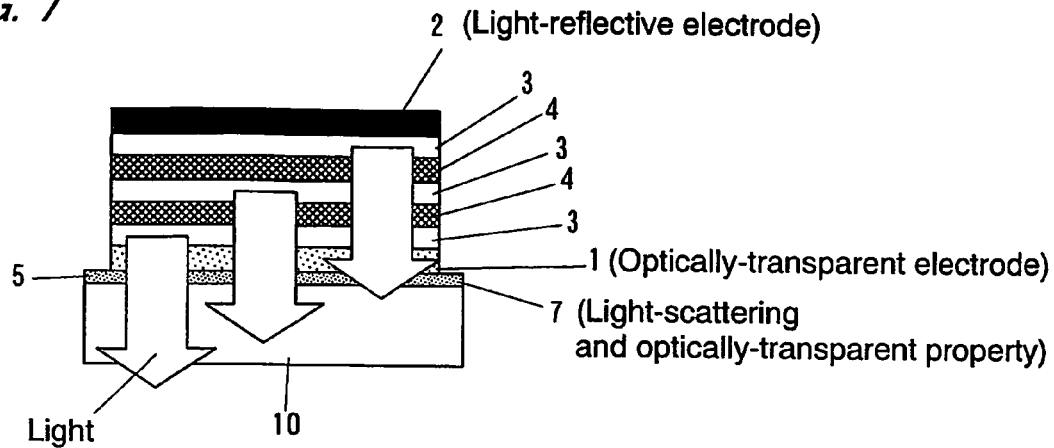
FIG. 7 is a schematic sectional view showing one example of an embodiment of Claim 5.

FIG. 7 shows one example of an embodiment of Claims 1 and 5 of the present invention, in which one of the anode 1 and the cathode 2 is formed by a light reflective electrode, and the other is formed by an optically-transparent electrode, and a light-scattering and light-reflective element 7 is provided on the optically-transparent electrode on the opposite side of the emission layers 3. By this light-scattering and optically-transparent element 7, the light scattering means 5 is formed. In the embodiment of FIG. 7, the anode 1, on the substrate 10 side, is formed by the optically transparent electrode, and the cathode 2, on the opposite side of the substrate 10, is formed by the light reflective electrode. Of course, the anode 1 and the cathode 2 can be interchanged.

The light-scattering and optically-transparent element 7 can be formed by the above mentioned light-scattering and optically-transparent electrode or a layer similar to the light scattering layer 6b and so on. The light-scattering and light-reflective element 7 may be formed on the optically-transparent electrode directly, or another component may be inserted between the optically-transparent electrode and the element 7.

Although the refractive index of a material of a layer which constitutes the light-scattering and light-reflective element 7 does not necessarily depend on the refractive index of two materials on both sides, when the light-scattering and light-reflective element 7 is provided between two materials having different refractive indexes, such as between the optically-transparent electrode and the substrate 10, it is preferable that, when the material of the layer forming the light-scattering and light-reflective element 7 is composed of one kind of material, the refractive index of the material of the layer is close to that of either one of the two materials, and, when the material of the layer is composed of two or more kinds of materials, it is preferable that one refractive index is close to that of one side and the other refractive index is close to that of the other side. In this case, it becomes possible to reduce a total reflection percentage of the light injected into or outputted from the light-scattering and light-reflective element 7, and as a result, it is possible to increase the light use efficiency. For reference, regardless of whether the optically-transparent electrode is provided on the substrate 10 or the light reflective electrode is provided on the substrate 10, when the unevenness is formed on the substrate 10 for forming the organic light emitting device, the unevenness may affect a part of a shape or an entire shape of not only the immediately above electrode, but also an organic layer such as the emission layer 3, the equipotential surface forming layer 4 or the charge generating layer 4, and the anode 1 and the cathode on the counter side, and each layer may be made into an uneven shape. However, it does not become a problem as long as it does not affect the obtained organic light emitting device vitally.

In the organic light emitting device of FIG. 7 formed as above, some light emitted from each emission layer 3 travels to the anode 1 side and is outputted through the optically-transparent anode 1 and the substrate 10, which is made of glass and so on to be optically transparent, and other light which traveled to the cathode 2 side from each emission layer 3 is reflected by the light reflective cathode 2 and is outputted through the anode 1 and the substrate 10. At that time, because the light-scattering and light-reflective element 7 is provided on the outer surface of the anode 1, the light passes through the light-scattering and light-reflective element 7 from the anode 1, and it is scattered at the time. Therefore, both the light traveled to the anode 1 side and the reflected light are outputted through the substrate 10 in random directions in a scattered condition, whereby the angle dependency of the emission brightness and the emission color can be reduced.

Figure 8:
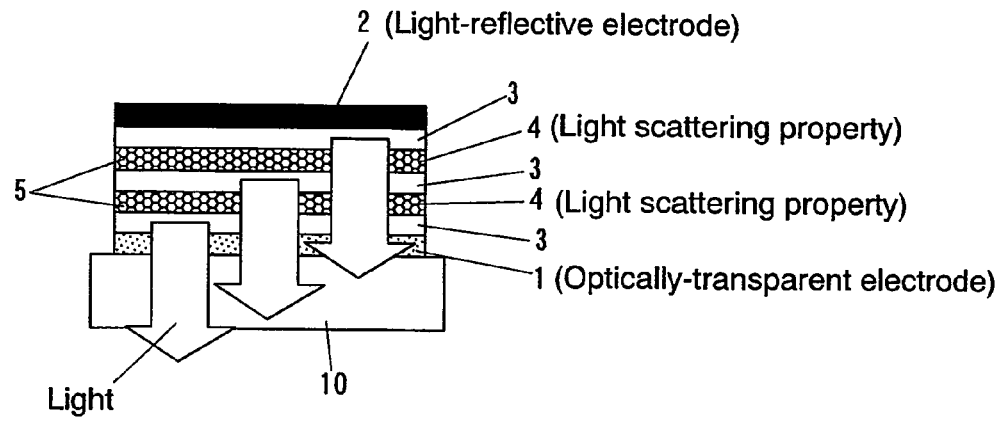
FIG. 8 is a schematic sectional view showing one example of an embodiment of Claim 6.

FIG. 8 shows one example of an embodiment of Claims 1 and 6 of the present invention, in which the equipotential surface forming layer 4 or the charge generating layer 4 provided between the adjacent emission layers 3 is formed to have a light scattering property. By this equipotential surface forming layer 4 or this charge generating layer 4, the light scattering means 5 is formed. In the embodiment of FIG. 8, the anode 1, on the substrate 10 side, is formed by the optically-transparent electrode, and the cathode 2, on the opposite side of the substrate 10, is formed by the light reflective electrode. Of course, the anode 1 and the cathode 2 can be interchanged.

As to a method for forming the equipotential surface forming layer 4 or the charge generating layer 4 so that it has a light scattering property, for example, a method which forms the equipotential surface forming layer 4 or the charge generating layer 4 so that the thickness of the layer 4 differs partly, using a plurality of masks in forming the equipotential surface forming layer 4 or the charge generating layer 4 as mentioned above, a method which forms the layer 4 so that it has different components inside it partly, a method which removes a part of the charge generating layer 4 by means of liftoff and laser processing and so on, and a method which forms a conductive film, such as a transparent conductive film and a metal film, partly at any position in the thickness direction of the charge generating layer 4, can be applied. When a plurality of the equipotential surface forming layers 4 or the charge generating layers 4 are formed in the device structure, only any one of the equipotential surface forming layers 4 or the charge generating layers 4 has to have a light scattering property, and all the equipotential surface forming layers 4 or the charge generating layers 4 do not always have to have a light scattering property. Other constitutions are the same as FIG. 1.

In the organic light emitting device of FIG. 8 formed as above, some light emitted from each emission layer 3 travels to the anode 1 side and is outputted through the optically-transparent anode 1 and the substrate 10, which is made of glass and so on to be optically transparent, and other light which traveled to the cathode 2 side from each emission layer 3 is reflected by the light reflective cathode 2 and is outputted through the anode 1 and the substrate 10. At that time, because the equipotential surface forming layer 4 or the charge generating layer 4 located in the device has the light scattering property, the light is scattered when it passes through the equipotential surface forming layer 4 or the charge generating layer 4. Therefore, both the light traveled to the anode 1 side and the reflected light are outputted through the anode 1 and the substrate 10 in random directions in a scattered condition, and they do not generate optical interference. So, the angle dependency of the emission brightness and the emission color can be reduced.

Figure 9:
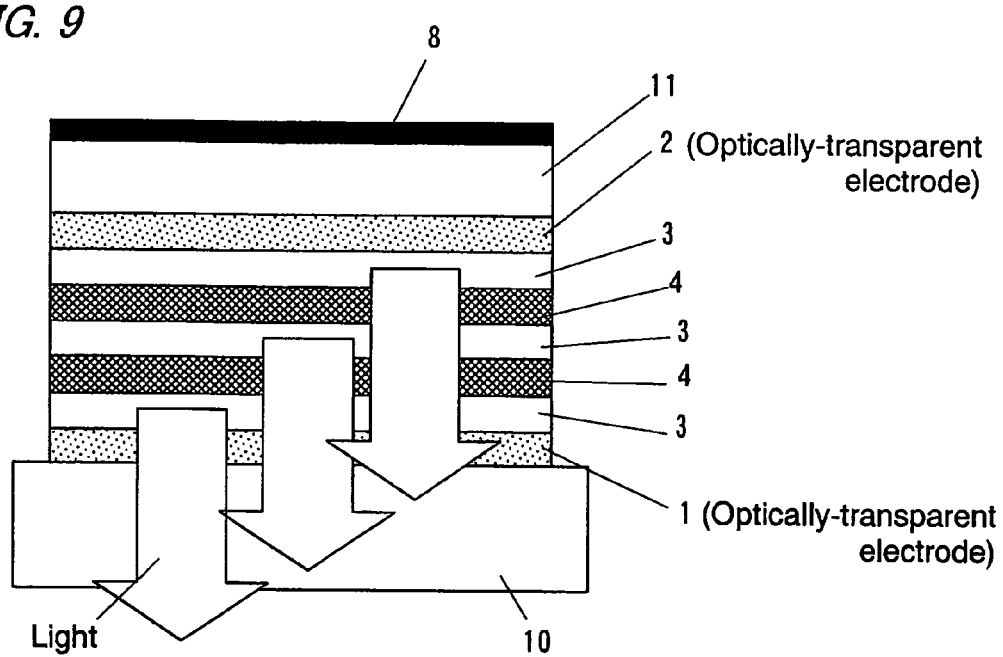
FIG. 9 is a schematic sectional view showing one example of an embodiment of Claim 7.

FIG. 9 shows one example of an embodiment of Claim 7 of the present invention, in which both the anode and the cathode are formed by optically-transparent electrodes, and a light reflective element 8 is provided on one of the anode 1 and the cathode 2 on the opposite side of the emission layers 3. In the embodiment of FIG. 8, the cathode 2 is disposed on the opposite side of the substrate 10, which is formed to have optical transparency to output the emitted light, and the light reflective element 8 is provided on the outer side of the cathode 2. Of course, the anode 1 and the cathode 2 can be interchanged. Furthermore, the light reflective element 8 is provided in a position away from the cathode 2 so that a distance between the emission layer 3 which is disposed at the opposite end of the light output side and a reflective surface of the light reflective element 8 becomes longer than or equal to a distance where optical interference does not occur substantively. The distance between the emission layer 3 and the reflective surface of the light reflective element 8 is not particularly limited, but preferably, it is in the range of about 1 μm-1 mm. If the distance is less than 1 μm, certain degree of optical interference may occur, and if the distance is beyond 1 mm, emission position misalignment may be sighted in observing it in a direction except the vertical direction, particularly when an emission area is small.

In the embodiment of FIG. 9, an optical spacer 11 is provided between the emission layer 3 and the light reflective element 8 as an optical buffering element to set the distance between the emission layer 3 and the light reflective element 8 longer than or equal to the distance where optical interference does not occur substantively. As to a material and a forming method of the optical spacer 11, any material and method can be applied as long as it has high optical transmission and does not affect the organic light emitting device. For example, the spacer 11 is formed by an inorganic film, such as a coating of transparent resin, an adhesion of a transparent film, a transparent glass, a silica film formed by sputtering, vapor deposition, and so on, or by an organic film formed by a similar method. When the optical spacer 11 is made from one material, it is preferable that it has a refractive index close to that of the adjacent material. As is the case with the first embodiment of the present invention, the optical spacer 11 may have a light scattering property. When the spacer has a light scattering property and is made from two or more material components having different refractive indexes from each other, it is preferable that any material component has a refractive index close to that of the adjacent optically-transparent electrode. The light reflective element 8 can be similarly formed from the above mentioned material for forming the light reflective electrode or a material for forming the light reflective layer 6a of FIG. 5. Because it is not always necessary that the light reflective element 8 is attached closely to the cathode 2 (the optically-transparent electrode), an optical spacer 11 on which the light reflective element 8 is provided may be formed separately and placed near the cathode 2, or only the light reflective element 8 may be placed near the cathode 2 through an air layer or a vacuum layer. Other constitutions are the same as FIG. 1.

In the organic light emitting device of FIG. 9 formed as above, some light emitted from each emission layer 3 travels to the anode 1 side and is outputted through the optically-transparent anode 1 and the substrate 10, which is made of glass and so on to be optically transparent, and other light which traveled to the cathode 2 side from each emission layer 3 is reflected by the light reflective element 8 through the cathode 2 and travels to the anode 1 side, and is outputted through the anode 1 and the substrate 10. At that time, because the distance between the emission layer 3 and the light reflective element 8 is set to a distance longer than or equal to the distance where optical interference does not occur, the light which passed through the cathode 2 and traveled to the light reflective element 8 is approximately regularly reflected by the reflective surface of the light reflective element 8 and returns to the anode 1 side, and is outputted without generating interference with the light traveled to the anode 1 side from the emission layers 3. Therefore, the angle dependency of the emission brightness and the emission color can be reduced. As a result, the change of the emission brightness and the emission color with respect to the film thickness fluctuations become small, and the use efficiency of the light can be increased.

The organic light emitting device of this kind has a high degree of flexibility in film thickness design of the device, because it is not influenced by the interference effect with the light reflected by the light reflective element 8 as mentioned above. Concretely speaking, it is unnecessary for such an organic light emitting device to set an optical distance between the emission layers and an electrode mirror to an odd number multiple of a quarter of a wavelength, as is well known. And, a need for setting an optical distance between the emission layers and a maximum refractive index step position to an even number multiple of a quarter of a wavelength becomes small. That is, it becomes possible to form an element of an arbitrary film thickness according to an element efficiency and other properties, which means that color shift of the emission color is small even when a film thickness shift occurs, and it is possible to ease exactitude of a film thickness control.

Figure 10:
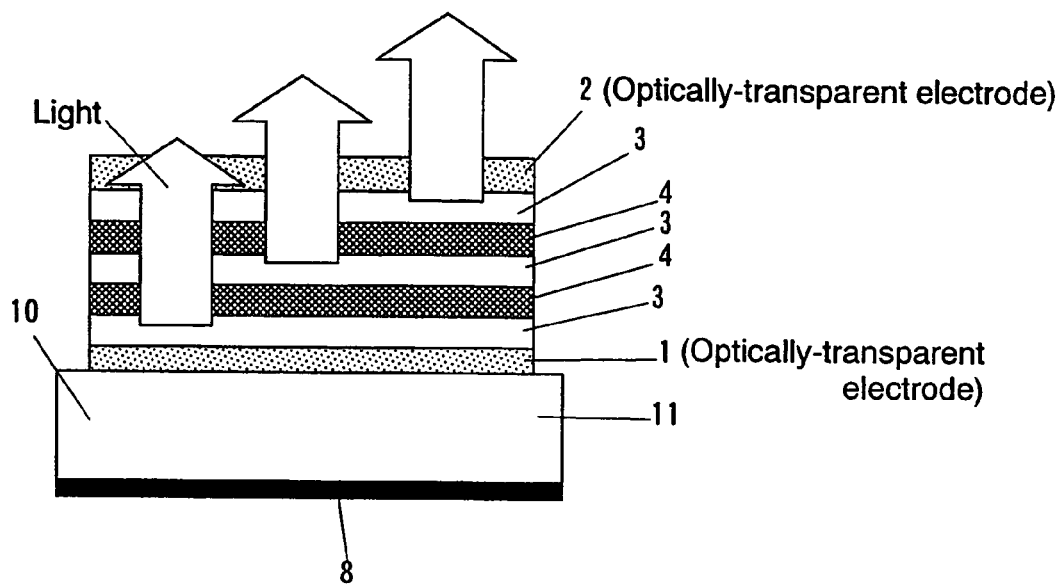
FIG. 10 is a schematic sectional view showing one example of another embodiment of Claim 7.

FIG. 10 shows one example of other embodiments of Claim 7 of the present invention, in which both the anode and the cathode are formed by optically-transparent electrodes, and a light reflective element 8 is provided on an outer surface of the substrate 10, which is made of glass and so on to be optically transparent. In the embodiment of FIG. 10, the anode 1 is provided on the surface of the substrate 10, and the cathode 2 is disposed on the opposite side of the substrate 10, and the light reflective element 8 is provided on the outer side of the substrate 10 on the opposite side of the emission layers 3. Of course, the anode 1 and the cathode 2 can be interchanged. Furthermore, in this embodiment, a distance between the emission layer 3 disposed at the opposite end from the light output side and a reflective surface of the light reflective element 8 is set to a distance longer than or equal to a distance where optical interference does not occur substantively using the substrate 10. That is, the substrate 10 acts as an optical spacer 11 between the anode 1 and the light reflective element 8. Other constitutions are the same as FIG. 1.

In the organic light emitting device of FIG. 10 formed as above, some light emitted from each emission layer 3 travels to the cathode 2 side and is outputted through the optically-transparent cathode 2, and other light which traveled to the anode 1 side from each emission layer 3 passes through the optically-transparent anode 1 and the substrate 10 and is reflected by the light reflective element 8, and travels to the cathode 2 side and is outputted through the cathode 2. At that time, because the distance between the emission layer 3 and the light reflective element 8 is set to a distance longer than or equal to the distance where optical interference does not occur, the light which passed through the anode 1 and traveled to the light reflective element 8 is approximately regularly reflected by the reflective surface of the light reflective element 8 and returns to the cathode 2 side, and is outputted without generating interference with the light traveled to the cathode 2 side from the emission layers 3.

In each of the above embodiments, a plurality of emission layers 3 may emit different colors. At that time, it is not necessary that every emission layer 3 emits different colors, but at least two different colors may be emitted from the emission layers 3. When different colors are emitted form the emission layers 3, light of a mined color of the different colors can be outputted from the organic light emitting device, whereby it becomes possible to create organic light emitting devices of many colors. The emission color can be adjusted by selecting the number of layers of the emission layer 3 and emission colors. When the colors emitted from each emission layer 3 are the lights three primary colors or complimentary colors, the mined color emitted from the plurality of emission layers 3 becomes white color. Therefore, in this case, it is possible to use the organic light emitting device as a back light of a liquid crystal display, light source of lighting, and so on.

The structures of the organic light emitting devices shown in the above figures are only examples, and the present invention is not limited thereto, and the present invention can use any combination of each structure. As to the internal constitution of the device exemplified above, such as the substrate, organic materials (for example, a hole injection material, a hole transport material, an emission layer host, an emission layer dopant, an electronic transport material, and an electronic injection material), and various kinds of materials (for example, the electrode, a material for the charge generating layer, a material for the equipotential surface, a metal complex, and various types of inorganic materials), and a stacking order and components of the organic layers (for example, the emission layer, a hole transport layer, an electron injection layer), arbitrary known ones can be used unless it is against the spirit of the present invention.

EXAMPLES

Next, the present invention will be explained using examples.

Example 1

Silica particle slurry which was 500 nm in average grain diameter was applied on a substrate 10 of alkali-free glass and was dried, and then it was baked at 600 degrees for 50 minutes. Average plane roughness of the surface of the substrate 10 was 130 nm, and maximum vertical interval thereof was about 2 μm. Then, the surface of the substrate 10 was cleaned by ultrasonic cleaning using acetone and isopropyl alcohol, and $UV/O_3$ cleaning, and then a film of Cr was formed on the surface of the substrate 10 to a thickness of 2200 Å by sputtering, and a Al film which was 800 Å in thickness was formed thereon by vacuum deposition, whereby an light-scattering and light-reflective electrode (cathode 2) was formed.

Figure 11A:
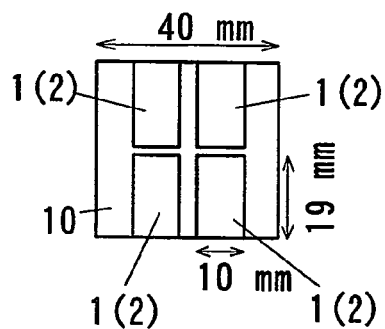
FIG. 11A is a plan view of a substrate used in examples and comparative examples.
Figure 11B:
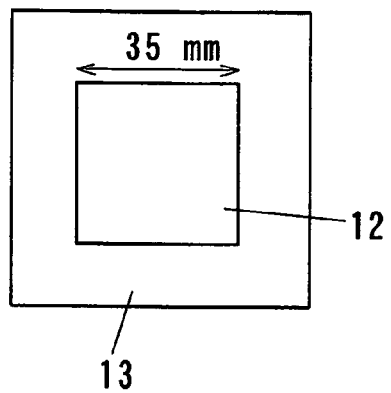
FIG. 11B is a plan view of a mask used in the examples and the comparative examples.

Next, the substrate 10 was set to a vacuum evaporation system, and an electron injection layer was formed on the cathode 2 by co-depositing bathocuproine (manufactured by DOJINDO LABORATORIES Corporation) and Cs at molar ratio of 1 to 1, to a thickness of 200 Å, under a reduced pressure of $5 \times 10^{-5}$ Pa, using a mask 13 with holes 12 shown in FIG. 11B. Then, a blue color emission layer 3 was formed on the electron injection layer by stacking, to a thickness of 500 Å, a layer comprising a dinaphthylanthracene derivative ("BH-2" manufactured by Kodak) doped with a 4 mass % distyrylarylene derivative (chemical formula 1). Then, a hole transport layer was formed on the emission layer 3 by depositing 4,4'-bis[N-(naphthyl)-N-phenyl-amino]biphenyl (hereinafter, called a α-NPD) (manufactured by Chemipro Fine Chemical Kaisha, Ltd.) to a thickness of 800 Å at vapor deposition speed of 1 Å/s. Then a charge generating layer 4 was formed on the hole transport layer by depositing vanadium pentoxide ($V_2O_5$) to a thickness of 100 Å at film forming speed of 2 Å/s.

After that, according to the above procedure, an electron injection layer of a thickness of 200 Å, an emission layer having a thickness of 500 Å, a hole transport layer having a thickness of 700 Å, a charge generating layer 4 having a thickness of 100 Å, an electron injection layer having a thickness of 200 Å, an emission layer having a thickness of 500 Å, a hole transport layer having a thickness of 800 Å were stacked thereon.

Finally, Au which was 100 Å in thickness was deposited thereon at vapor deposition speed of 1 Å/s to form an optically-transparent electrode (anode 1), whereby an organic light emitting device having three emission layers 3 was manufactured (see FIG. 1).

(Chemical formula 1)

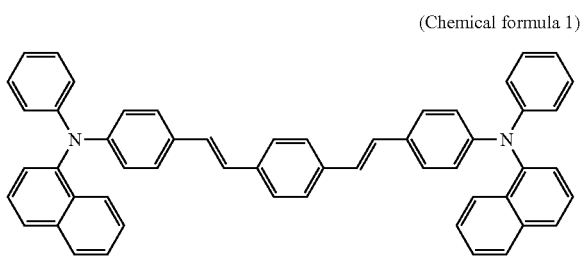

Example 2

An ITO thin film was formed by sputtering on a surface of a substrate 10 formed by an alkali-free substrate glass plate having a thickness of 0.7 mm, whereby an optically-transparent electrode (cathode 2) having a thickness of 1100 Å and sheet resistance of 12Ω/□ was formed. The glass substrate 10 and the ITO cathode 2 was etched and cut into a shape shown in FIG. 11A, and then it was cleaned by ultrasonic cleaning using pure water, acetone, and isopropyl alcohol, for ten minutes, respectively, and then it was cleaned by steam cleaning using isopropyl alcohol steam for two minutes and it was dried, and then it was cleaned by UV ozone wash for 30 minutes.

Then, the surface of the substrate 10 opposite to the surface where the cathode 2 was formed was roughened by sandblast with roughness of #220, and then an Al film having a thickness of 1000 Å was formed on the roughened surface, whereby a light-scattering and light-reflective element 6 was formed.

After that, as is the case with the first example, on the cathode 2 of the substrate 10, an electron injection layer having a thickness of 200 Å, an emission layer having a thickness of 500 Å, a hole transport layer having a thickness of 700 Å, a charge generating layer 4 having a thickness of 100 Å, an electron injection layer having a thickness of 200 Å, an emission layer having a thickness of 500 Å, a hole transport layer having a thickness of 700 Å, a charge generating layer 4 having a thickness of 100 Å, an electron injection layer having a thickness of 200 Å, an emission layer having a thickness of 500 Å, a hole transport layer having a thickness of 800 Å were stacked in this order, and then Au which was 100 Å in thickness was deposited thereon at vapor deposition speed of 1 Å/s to form an optically-transparent electrode (anode 1), whereby an organic light emitting device having three emission layers 3 was manufactured (see FIG. 4).

Example 3

As is the case with the second example, an organic light emitting device was manufactured according to the example 1, using the substrate 10 on which the light-scattering and light-reflective element 6 was formed on the opposite surface of the cathode 2. However, a film thickness and a layer construction were as follows. An electron injection layer having a thickness of 200 Å and comprising a co-deposition layer of bathocuproine and Cs of molar ratio of 1 to 1, an electron transport layer having a thickness of 500 Å and comprising only bathocuproine, an emission layer having a thickness of 300 Å and formed by co-deposition of Alq and rubrene with 7% weight fraction of rubrene, a hole transport layer having a thickness of 400 Å, a charge generating layer 4 having a thickness of 100 Å and comprising vanadium oxide, an electron injection layer having a thickness of 200 Å and comprising a co-vapor deposition layer of bathocuproine and Cs of molar ratio of 1 to 1, an emission layer 3 having a thickness of 500 Å and comprising BH-2 and a styrylarylene derivative, a hole transport layer having a thickness of 700 Å, a charge generating layer 4 having a thickness of 100 Å, an electron injection layer having a thickness of 200 Å, an emission layer having a thickness of 500 Å and comprising BH-2 and a styrylarylene derivative, and a hole transport layer having a thickness of 800 Å were stacked in this order, and finally, Au which was 100 Å in thickness was deposited thereon at vapor deposition speed of 1 Å/s to form an optically-transparent electrode (anode 1), whereby an organic light emitting device having three emission layers 3 was manufactured (see FIG. 4).

Example 4

Silica particles which was 200 nm in average grain diameter were added to "ADEKA ITO embrocation (ITO-L)" (manufactured by ADEKA CORPORATION) so that a weight ratio of ITO and silica was 20 to 1, and were mixed and dispersed. Then, the liquid mixture was spin-coated on an alkali-free glass substrate 10 and dried in the atmosphere at 160 degrees for 5 minutes, and then it was baked at 300 degrees for 120 minutes, and then an annealing treatment was performed. The process was repeated three times, whereby an ITO silica mixed film having 5300 Å in average thickness was obtained. Then, the film was polished by a polishing machine to adjust it to be 4800 Å in average thickness and 1.3 nm in plane average roughness. Then, the substrate 10 was washed by using ion-exchange water, and an ITO film having a thickness of 200 Å was formed on the ITO silica mixed film by sputtering, whereby a light-scattering and light-reflective electrode (anode 1) was formed. The sheet resistance of the anode 1 was 72Ω/□, the light transmission of the substrate 10 was 69%, and the haze was 82%.

Figure 11C:
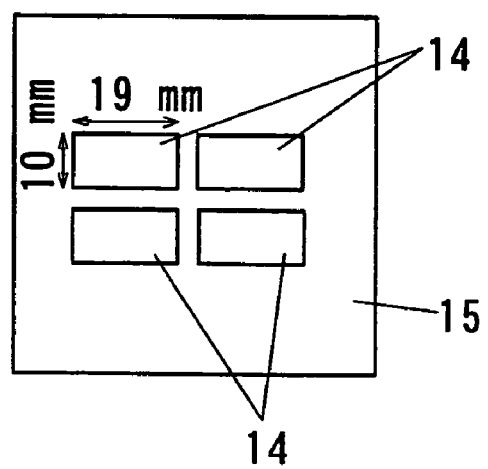
FIG. 11C is a plan view of a mask used in the examples and the comparative examples.

Next, the substrate 10 was set to a vacuum evaporation system, and a hole transport layer was formed on the anode 1 by depositing a-NPD to a thickness of 800 Å at vapor deposition speed of 1 Å/s under a reduced pressure of $5 \times 10^{-5}$ Pa, using a mask 13 shown in FIG. 11B. Then, a blue color emission layer 3 was formed on the hole transport layer by stacking, to a thickness of 500 Å, a layer comprising a dinaphthylanthracene derivative ("BH-2" manufactured by Kodak) doped with a 4 mass % distyrylarylene derivative (Chemical formula 1). Then, an electron injection layer was formed on the emission layer 3 by co-depositing bathocuproine (manufactured by DOJINDO LABORATORIES Corporation) and Cs at molar ratio of 1 to 1, to a thickness of 200 Å. Then a charge generating layer 4 was formed by depositing vanadium pentoxide ($V_2O_5$) to a thickness of 100 Å at vapor deposition speed of 2 Å/s. After that, according to the above procedure, a hole transport layer having a thickness of 700 Å, an emission layer having a thickness of 500 Å, an electron injection layer having a thickness of 200 Å, a charge generating layer 4 having a thickness of 100 Å, a hole transport layer having a thickness of 700 Å, an emission layer having a thickness of 500 Å, an electron injection layer having a thickness of 200 Å were stacked thereon. Finally, Al, as a cathode, was stacked thereon to a thickness of 800 Å at film forming speed of 4 Å/s, using a mask 15 with holes 14 shown in FIG. 11C to form a light reflective electrode (a cathode 2), whereby an organic light emitting device having three emission layers 3 was manufactured (see FIG. 6).

Example 5

Silica particle slurry which was 500 nm in average grain diameter was applied on a substrate 10 of alkali-free glass and was dried, and then it was baked at 600 degrees for 50 minutes, whereby a light-scattering and optically-transparent element 7 was formed. Average plane roughness of the surface of the substrate 10 on which the light-scattering and optically-transparent element 7 was formed was 130 nm, and maximum vertical interval thereof was about 2 μm.

Using this substrate 1, an ITO thin film was formed by sputtering on the surface of the light-scattering and optically-transparent element 7, whereby an optically-transparent electrode (anode 1) having a thickness of 1100 Å and sheet resistance of 12Ω/□ was formed. Then, the glass substrate 10 and the ITO anode 1 was etched and cut into a shape shown in FIG. 11A, and then it was cleaned by ultrasonic cleaning using pure water, acetone, and isopropyl alcohol, for ten minutes, respectively, and then it was cleaned by steam cleaning using isopropyl alcohol steam for two minutes, and it was dried, and then it was cleaned by UV ozone wash for 30 minutes.

Then, each layer was formed, as is the case with the example 4, whereby an organic light emitting device having three emission layers 3 was manufactured (see FIG. 7).

Example 6

Using a substrate 10 on which the optically-transparent electrode (anode 1) of the ITO thin film similar to that of the example 2 was formed, each layer was formed on the anode 1 of the substrate 10, as is the case with the example 4. Then, a light scattering sheet, "100-GM2" (manufactured by KIMOTO CO.,LTD) was pasted on the surface of the substrate 10 on the opposite side of the anode 1 by means of matching oil having a refractive index of 1.63 to form a light-scattering and optically-transparent element 7, whereby an organic light emitting device having three emission layers 3 was manufactured (see FIG. 7, in which, however, the light-scattering and optically-transparent element 7 was formed on the outer surface of the substrate 10).

Example 7

An organic light emitting device having three emission layers 3 was manufactured, as is the case with the example 5 except that the electron injection layer was 50 Å in film thickness (see FIG. 7).

Example 8

The glass substrate 10 on which the optically-transparent electrode (anode 1) of the ITO thin film similar to that of the example 2 was formed was used. The substrate 10 was set to a vacuum evaporation system, and a hole transport layer was formed on the anode 1 by depositing α-NPD to a thickness of 800 Å at vapor deposition speed of 1 Å/s under a reduced pressure of $5 \times 10^{-5}$ Pa, using a mask 13 shown in FIG. 11B. Then, a blue color emission layer 3 was formed on the hole transport layer by stacking, to a thickness of 500 Å, a layer comprising a dinaphthylanthracene derivative ("BH-2" manufactured by Kodak) doped with a 4 mass % distyrylarylene derivative (chemical formula 1). Then, an electron injection layer was formed on the emission layer 3 by co-depositing bathocuproine (manufactured by DOJINDO LABORATORIES Corporation) and Cs at molar ratio of 1 to 1. In this process of the electron injection layer, first, the bathocuproine and Cs were deposited to a thickness of 100 Å by using the mask 13 of FIG. 11B, and then, they were deposited thereon to a 300 Å thickness by overlaying another mask having a 20 μm width line and a 20 μm line interval, whereby unevenness was formed on the surface of the electron injection layer. Then a light-scattering charge generating layer 4 was formed by depositing vanadium pentoxide ($V_2O_5$) on the uneven surface of the electron injection layer to a thickness of 100 Å at film forming speed of 2 Å/s. After that, according to the above procedure, a hole transport layer having a thickness of 700 Å, an emission layer having a thickness of 500 Å, an electron injection layer having a thickness of 200 Å, a light-scattering charge generating layer 4 having a thickness of 100 Å, a hole transport layer having a thickness of 700 Å, an emission layer having a thickness of 500 Å, an electron injection layer having a thickness of 200 Å were stacked thereon. Finally, Al, as a cathode, was stacked to a thickness of 800 Å at vapor deposition speed of 4 Å/s, using a mask 15 with holes 14 shown in FIG. 11C to form a light reflective electrode (a cathode 2), whereby an organic light emitting device having three emission layers 3 was manufactured (see FIG. 8).

Comparative Example 1

An ITO thin film was formed by sputtering on a surface of a transparent substrate 10 formed by an alkali-free substrate glass plate having a thickness of 0.7 mm, whereby an optically-transparent electrode (anode 1) having a thickness of 1100 Å and sheet resistance of 12Ω/□ was formed. Then, the glass substrate 10 and the ITO anode 1 was etched and cut into a shape shown in FIG. 11A, and then it was cleaned by ultrasonic cleaning using pure water, acetone, and isopropyl alcohol, for ten minutes, respectively, and then it was cleaned by steam cleaning using isopropyl alcohol steam for two minutes, and it was dried, and then it was cleaned by UV ozone wash for 30 minutes.

Figure 12:
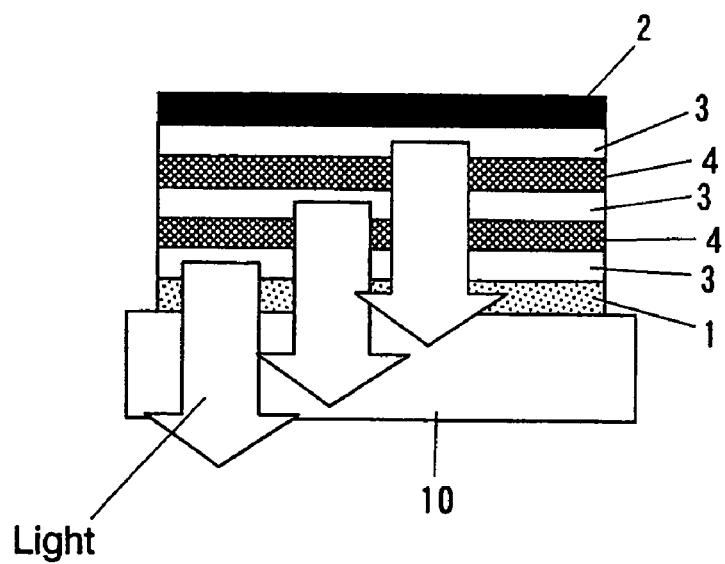
FIG. 12 is a schematic sectional view showing a conventional example.

Next, the substrate 10 was set to a vacuum evaporation system, and a hole transport layer was formed on the anode 1 by depositing a-NPD to a thickness of 800 Å at vapor deposition speed of 1 Å/s under a reduced pressure of $5 \times 10^{-5}$ Pa, using a mask 13 shown in FIG. 11B. Then, a blue color emission layer 3 was formed on the hole transport layer by stacking, to a thickness of 500 Å, a layer comprising a dinaphthylanthracene derivative ("BH-2" manufactured by Kodak) doped with a 4 mass % distyrylarylene derivative (Chemical formula 1). Then, an electron injection layer was formed on the emission layer 3 by co-depositing bathocuproine (manufactured by DOJINDO LABORATORIES Corporation) and Cs at molar ratio of 1 to 1, to a thickness of 200 Å. Then a charge generating layer 4 was formed by depositing vanadium pentoxide ($V_2O_5$) to a thickness of 100 Å at film forming speed of 2 Å/s. After that, according to the above procedure, a hole transport layer having a thickness of 700 Å, an emission layer having a thickness of 500 Å, an electron injection layer having a thickness of 200 Å, a charge generating layer 4 having a thickness of 100 Å, a hole transport layer having a thickness of 700 Å, an emission layer having a thickness of 500 Å, an electron injection layer having a thickness of 200 Å were stacked thereon. Finally, Al, as a cathode, was stacked to a thickness of 800 Å at film forming speed of 4 Å/s, using a mask 15 with holes 14 shown in FIG. 11C to form a light reflective electrode (a cathode 2), whereby an organic light emitting device having three emission layers 3 was manufactured (see FIG. 12).

Comparative Example 2

An organic light emitting device having three emission layers 3 was manufactured, as is the case with the comparative example 1 except that the electron injection layer was 50 Å in film thickness.

Comparative Example 3

Using a substrate 10 having the ITO thin film similar to that of the comparative example 1, a reflective surface was formed on a surface of the substrate on the opposite side of the ITO thin film by depositing a Al film of a thickness of 1000 Å.

The ITO thin film of the substrate 10 was used as an optically-transparent cathode 2, and as is the case with the example 1, on the cathode 2, an electron injection layer having a thickness of 200 Å, an emission layer having a thickness of 500 Å, a hole transport layer having a thickness of 700 Å, a charge generating layer 4 having a thickness of 100 Å, an electron injection layer having a thickness of 200 Å, an emission layer having a thickness of 500 Å, a hole transport layer having a thickness of 700 Å, a charge generating layer 4 having a thickness of 100 Å, an electron injection layer having a thickness of 200 Å, an emission layer having a thickness of 500 Å, a hole transport layer having a thickness of 800 Å were stacked in this order, and finally, Au which was 100 Å in thickness was deposited thereon at vapor deposition speed of 1 Å/s to form an optically-transparent electrode (anode 1), whereby an organic light emitting device having three emission layers 3 was manufactured.

Comparative Example 4

Using a substrate similar to that of the comparative example 1 having the ITO thin film, a reflective surface was formed on a surface of the substrate on the opposite side of the ITO thin film by depositing a Al film of a thickness of 1000 Å.

The ITO thin film of the substrate 10 was used as an optically-transparent cathode 2, and as is the case with the example 3, on the cathode 2, an electron injection layer having a thickness of 200 Å and comprising a co-vapor deposition layer of bathocuproine and Cs of molar ratio of 1 to 1, an electron transport layer having a thickness of 500 Å and comprising only bathocuproine, an emission layer having a thickness of 300 Å and formed by co-deposition of Alq and rubrene with 7% weight fraction of rubrene, a hole transport layer having a thickness of 400 Å, a charge generating layer 4 having a thickness of 100 Å and comprising vanadium oxide, an electron injection layer having a thickness of 200 Å, an emission layer having a thickness of 500 Å and comprising BH-2 and a styrylarylene derivative, a hole transport layer having a thickness of 700 Å, a charge generating layer 4 having a thickness of 100 Å, an electron injection layer having a thickness of 200 Å, an emission layer having a thickness of 500 Å and comprising BH-2 and a styrylarylene derivative, and a hole transport layer a thickness of 800 Å were stacked in this order, and finally, Au which was 100 Å in thickness was deposited thereon at vapor deposition speed of 1 Å/s to form an optically-transparent electrode (anode 1), whereby an organic light emitting device having three emission layers 3 was manufactured.

The organic light emitting devises manufactured as above in the examples 1 to 8 and the comparative examples 1 to 4 each were connected to a power supply (KEITHLEY model 2400), and were driven at a constant current of 5 mA/cm$^2$, and brightness at the time was measured by using a brightness photometer ("BM-9" manufactured by TOPCON TECHNOHOUSE CORPORATION. View angle: 0.20; A distance: 45 cm). Furthermore, the CIE chromaticity was measured by using a multichannel analyzer ("PMA-11" manufactured by Hamamatsu Photonics K.K. Measurement distance: 5 cm). These measurements were carried out in the vertical front side direction (0) of the organic light emitting device and in the direction of 45° with respect to the vertical front side direction.

And, a ratio of the brightness measured in the 0° direction and the brightness measured in the 45° direction was calculated, and a difference between the CIE-x value (x1) and the CIE-y value (y1) of the CIE chromaticity coordinate value when observed in the 0° direction, a difference between the CIE-x value (x2) and the CIE-y value (y2) of the CIE chromaticity coordinate value when observed in the 450 direction, and a value of $((x1-x2)^2+(y1-y2))$ were calculated. These results were shown in TABLE 1.

TABLE 1

|  | 0° | 45° | ratio/difference | $(x1-x2)^2 + (y1-y2)^2$ | 0° | 45° | ratio/difference | $(x1-x2)^2 + (y1-y2)^2$ |
|---|---|---|---|---|---|---|---|---|
|  | | | Example 1 | | | | | |
| Brightness (cd/m$^2$) | 753 | 740 | 1:0.98 | | | | | |
| Chromaticity CIExy | x: 0.160 y: 0.318 | x: 0.157 y: 0.314 | Δx: −0.003 Δy: −0.004 | $0.25 \times 10^{-4}$ | | | | |
|  | | | Example 2 | | | | Comparative example 3 | |
| Brightness (cd/m$^2$) | 1080 | 957 | 1:0.89 | | 917 | 551 | 1:0.60 | |
| Chromaticity CIExy | x: 0.172 y: 0.282 | x: 0.180 y: 0.301 | Δx: +0.008 Δy: +0.019 | $4.3 \times 10^{-4}$ | x: 0.138 y: 0.245 | x: 0.158 y: 0.168 | Δx: +0.020 Δy: −0.077 | $6.3 \times 10^{-3}$ |
|  | | | Example 3 | | | | Comparative example 4 | |
| Brightness (cd/m$^2$) | 1739 | 1582 | 1:0.91 | | 1420 | 1039 | 1:0.73 | |
| Chromaticity CIExy | x: 0.319 y: 0.371 | x: 0.327 y: 0.362 | Δx: +0.008 Δy: −0.009 | $1.5 \times 10^{-4}$ | x: 0.331 y: 0.383 | x: 0.352 y: 0.329 | Δx: −0.021 Δy: +0.054 | $3.4 \times 10^{-3}$ |
|  | | | Example 4 | | | | | |
| Brightness (cd/m$^2$) | 473 | 527 | 1:1.11 | | | | | |
| Chromaticity CIExy | x: 0.140 y: 0.208 | x: 0.159 y: 0.212 | Δx: +0.019 Δy: +0.004 | $3.8 \times 10^{-4}$ | | | | |

TABLE 1-continued

|  | 0° | 45° | ratio/ difference | $(x1-x2)^2 + (y1-y2)^2$ | 0° | 45° | ratio/ difference | $(x1-x2)^2 + (y1-y2)^2$ |
|---|---|---|---|---|---|---|---|---|
|  | \multicolumn{4}{c}{Example 5} | \multicolumn{4}{c}{Comparative example 1} |
| Brightness (cd/m$^2$) | 1176 | 994 | 1:0.85 |  | 825 | 456 | 1:0.55 |  |
| Chromaticity CIExy | x: 0.153 y: 0.221 | x: 0.159 y: 0.233 | Δx: +0.006 Δy: +0.012 | $1.8 \times 10^{-4}$ | x: 0.132 y: 0.236 | x: 0.147 y: 0.161 | Δx: +0.015 Δy: −0.075 | $5.9 \times 10^{-3}$ |
|  | \multicolumn{4}{c}{Example 6} | | | | |
| Brightness (cd/m$^2$) | 961 | 769 | 1:0.8 |  |  |  |  |  |
| Chromaticity CIExy | x: 0.140 y: 0.208 | x: 0.159 y: 0.212 | Δx: +0.019 Δy: +0.004 | $2.7 \times 10^{-4}$ |  |  |  |  |
|  | \multicolumn{4}{c}{Example 7} | \multicolumn{4}{c}{Comparative example 2} |
| Brightness (cd/m$^2$) | 790 | 892 | 1:1.13 |  | 635 | 600 | 1:0.95 |  |
| Chromaticity CIExy | x: 0.159 y: 0.217 | x: 0.170 y: 0.250 | Δx: +0.011 Δy: +0.033 | $1.2 \times 10^{-3}$ | x: 0.144 y: 0.186 | x: 0.176 y: 0.232 | Δx: +0.032 Δy: +0.046 | $3.1 \times 10^{-3}$ |
|  | \multicolumn{4}{c}{Example 8} | | | | |
| Brightness (cd/m$^2$) | 893 | 825 | 1:1.04 | 1:0.92 |  |  |  |  |
| Chromaticity CIExy | x: 0.165 y: 0.275 | x: 0.157 y: 0.262 | Δx: −0.008 Δy: −0.013 | $2.3 \times 10^{-4}$ |  |  |  |  |

As shown in TABLE 1, in the examples 1 to 8, the ratio between the brightness in the 0° direction and the brightness in the 450 direction and the difference of the chromaticity were small, and it was confirmed that the angle dependency of the emission brightness and the emission color thereof was small.

Example 9

Figure 11D:
FIG. 11D is a schematic sectional view of an optical spacer used in the examples.

According to the comparative example 1, an organic light emitting device was manufactured. However, the cathode 2 was formed as an optically-transparent electrode by stacking ITO to a thickness of 1000 Å at 4 Å/s by a facing target sputtering device, using the mask 15 of FIG. 11C. And, as shown in FIG. 11D, a light reflective element 8 comprising a Al film having a thickness of 10000 Å were formed on one side of an optical spacer 11 formed by a glass which was 0.4 mm in thickness, and the surface of the optical spacer 11 opposite to the light reflective element 8 was pasted on the surface of the cathode 2 by means of matching oil having a refractive index of 1.5, whereby an organic light emitting device having three emission layers 3 was manufactured (see FIG. 9).

Example 10

According to the example 9, an organic light emitting device was manufactured. However, the film thickness of the electron injection layer was set to 50 Å, and the optical spacer 11 with the light reflective element 8 was pasted on the surface of the substrate 10 on the opposite side of the anode 1 by means of matching oil having a refractive index of 1.5, whereby an organic light emitting device having three emission layers 3 was manufactured (see FIG. 10).

Comparative Example 5

According to the comparative example 1, an organic light emitting device was manufactured. However, a film thickness and a layer construction were as follows. The hole transport layer was 800 Å in thickness, the emission layer 3 comprising BH-2 and a styrylarylene derivative was 500 Å in thickness, the electron injection layer was 200 Å in thickness, the charge generating layer 4 was 100 Å in thickness, the hole transport layer was 700 Å in thickness, the emission layer formed by co-deposition of Alq and rubrene with 7% weight fraction of rubrene was 300 Å in thickness, the electron transport layer comprising bathocuproine was 500 Å in thickness, the electron injection layer was 200 Å in thickness, and the cathode 2 made of Al was 800 Å in thickness. And, a white color organic light emitting device was obtained (see FIG. 12).

Example 11

According to the comparative example 5, an organic light emitting device was manufactured. However, the cathode 2 was formed as an optically-transparent electrode by stacking ITO to a thickness of 1000 Å at 4 Å/s by a facing target sputtering device, using the mask 15 of FIG. 11C. Furthermore, the optical spacer 11 of FIG. 11D was pasted on the surface of the cathode 2 by means of matching oil having a refractive index of 1.5, whereby a white color organic light emitting device was manufactured (see FIG. 9).

In the organic light emitting device manufactured as above in the examples 9 to 11 and the comparative example 5, the brightness and the CIE chromaticity was measured in a similar way. And, the ratio of the brightness measured in the 0° direction and the brightness measured in the 450 direction was calculated, and the difference between the CIE-x value (x1) and the CIE-y value (y1) of the CIE chromaticity coordinate value when observed in the 0° direction, the difference between the CIE-x value (x2) and the CIE-y value (y2) of the CIE chromaticity coordinate value when observed in the 450 direction, and a value of $((x1-x2)^2+(y1-y2)^2)$ were calculated. These results were shown in TABLE 2.

TABLE 2

|  | 0° | 45° | ratio/ difference | $(x1-x2)^2 + (y1-y2)^2$ | 0° | 45° | ratio/ difference | $(x1-x2)^2 + (y1-y2)^2$ |
|---|---|---|---|---|---|---|---|---|
| | | | Example 9 | | | | | |
| Brightness (cd/m²) | 893 | 890 | 1:1.00 | | | | | |
| Chromaticity CIExy | x: 0.168 y: 0.299 | x: 0.163 y: 0.288 | Δx: −0.005 Δy: −0.011 | $1.5 \times 10-5$ | | | | |
| | | | Example 10 | | | | | |
| Brightness (cd/m²) | 880 | 895 | 1:1.02 | | | | | |
| Chromaticity CIExy | x: 0.162 y: 0.284 | x: 0.165 y: 0.291 | Δx: 0.003 Δy: 0.007 | $5.8 \times 10-5$ | | | | |
| | | | Example 11 | | | | Comparative example 5 | |
| Brightness (cd/m²) | 1265 | 1290 | 1:1.02 | | 1680 | 1370 | 1:0.82 | |
| Chromaticity CIExy | x: 0.323 y: 0.381 | x: 0.329 y: 0.375 | Δx: +0.006 Δy: −0.006 | $7.2 \times 10-4$ | x: 0.319 y: 0.379 | x: 0.362 y: 0.421 | Δx: +0.043 Δy: +0.042 | $3.6 \times 10-3$ |

As shown in TABLE 2, in the examples 9 to 11, the ratio between the brightness in the 0° direction and the brightness in the 45° direction and the difference of the chromaticity were small, and, it was confirmed that the angle dependency of the emission brightness and the emission color thereof was small.

The invention claimed is:

1. An organic light emitting device having a plurality of emission layers between an anode and a cathode,
   said emission layers being separated from each other by an equipotential surface forming layer or a charge generating layer,
   wherein said organic light emitting device further comprises:
   an optically-transparent substrate having a first surface and a second surface; and
   a light scattering means, at least either inside or outside the device, for scattering light emitted from said emission layers,
   wherein a first electrode of said anode or said cathode is an optically-transparent electrode having a first surface and a second surface, and the second surface of the first electrode is mounted on the first surface of the optically-transparent substrate,
   wherein a second electrode of said anode or said cathode has a first surface, and a second surface of the second electrode is mounted on the first surface side of the first electrode so that said emission layers intervene between the first surface of the first electrode and the second surface of the second electrode, and
   wherein the second electrode is a light-reflective electrode,
   wherein said organic light emitting device further comprises a layer having a first surface, and a second surface provided on the emission layers so that said layer intervene between the emission layers and the second surface of the second electrode, said layer having variations of a film thickness of the layer, said layer and the second surface side of the second electrode forming the light scattering means,
   wherein the layer between the emission layers and the second surface of the second electrode is an electron injection layer.

2. An organic light emitting device having a plurality of emission layers between an anode and a cathode,
   said emission layers being separated from each other by an equipotential surface forming layer or a charge generating layer,
   wherein said organic light emitting device has, at least either inside or outside the device, a light scattering means for scattering light emitted from said emission layers, and
   wherein said light scattering means is made up by forming said equipotential surface forming layer or said charge generating layer so that it has a light scattering property.

3. The organic light emitting device as set forth in claim 2, wherein
   said plurality of emission layers comprises emission layers of at least two different emission colors.

4. The organic light emitting device as set forth in claim 3, wherein an emission color of the organic light emitting device is white.

5. An organic light emitting device having a plurality of emission layers between an anode and a cathode,
   said emission layers are separated from each other by an equipotential surface forming layer or a charge generating layer,
   wherein said organic light emitting device further comprises an optically-transparent substrate having a first surface and a second surface,
   wherein a first electrode of said anode or said cathode is an optically-transparent electrode having a first surface and a second surface, and the second surface of the first electrode is mounted on the first surface of an optically-transparent substrate,
   wherein a second electrode of said anode or said cathode is an optically-transparent electrode having a first surface and a second surface, and the second surface of the second electrode is mounted on the first surface side of the first electrode so that the emission layers intervene between the first surface of the first electrode and the second surface of the second electrode,
   wherein a light reflective element is provided on the first surface side of the second electrode,
   wherein an optical spacer is provided between the first surface of the second electrode and the light reflective element,
   wherein the optical spacer is a single layer made from two or more material components having different refractive indexes from each other.

* * * * *